United States Patent [19]

Chin et al.

[11] Patent Number: 4,522,886
[45] Date of Patent: Jun. 11, 1985

[54] METHOD OF ION BEAM SYNTHESIS OF THIN SILICON NITRIDE FILMS AND RESULTING ARTICLES

[75] Inventors: Roland L. Chin, Williamsville; Susan A. Ferguson, W. Seneca, both of N.Y.

[73] Assignee: Allied Corporation, Morris Township, Morris County, N.J.

[21] Appl. No.: 659,147

[22] Filed: Oct. 9, 1984

[51] Int. Cl.$^3$ .............................................. B32B 9/04
[52] U.S. Cl. ....................................... 428/446; 427/38; 427/94; 427/286; 427/299; 427/399
[58] Field of Search ................ 428/446; 427/38, 94, 427/286, 299, 399

[56] References Cited

PUBLICATIONS

J. Ashley Taylor, et al., *Interactions of Ion Beams With Surfaces. Reactions of Nitrogen With Silicon and Its Oxides*, J. Chem. Phys. 68(4), Feb. 1978, pp. 1776-1784
G. E. Thomas, et al., *Preparation of Surface Silicon Nitride Films By Low Energy Ion Implantation*, Appl. Phys. Lett. 41(1), Jul. 1982, pp. 56-59.
P. Bourguet, et al., *Study of Buried Silicon Nitride Layers Synthesized By Ion Implantation*, J. Appl. Phys. 51(2), Dec. 1980, pp. 6169-6175.

*Primary Examiner*—Bernard D. Pianalto
*Attorney, Agent, or Firm*—Arthur J. Plantamura; Jay P. Friedenson

[57] ABSTRACT

A method is disclosed for the synthesis of ultra-thin silicon nitride ($Si_xN_y$) films by the direct interaction of a low energy noble ion beam (e.g. $Ar^+$ or $He^+$), with $NH_3$ physically absorbed on a silicon surface. The method is directed toward applications which require the use of ultra-thin insulating layers, such as in MIS technology.

The disclosed method provides for the synthesis of ultra-thin films of silicon nitride via the interaction of $NH_3$ absorbed on a silicon substrate and a low energy nobel ion beam. Preferential absorption of $NH_3$ is effected by cooling of the substrate below the boiling point of $NH_3$. The ion beam is used to generate reactive N and Si species which combine to form compounds of silicon nitride. The physical appearance of the films formed by this method is comparable to those produced by low pressure chemical vapor deposition.

14 Claims, 3 Drawing Figures

METHOD OF ION BEAM SYNTHESIS OF THIN SILICON NITRIDE FILMS AND RESULTING ARTICLES

DESCRIPTION

This invention relates to a method for the synthesis of ultra-thin silicon nitride ($Si_xN_y$) films by the direct interaction of a low energy noble gas ion beam with $NH_3$ physically absorbed on a silicon surface. More particularly, the invention is directed toward applications which require the use of ultra-thin insulating layers, such as in metal-insulator semiconductor (MIS) technology.

BACKGROUND OF THE INVENTION

The use of silicon nitride films for microelectronic applications is at present the focus of considerable research. Silicon nitride has been proposed as a substitute for $SiO_2$ as an insulating or masking or passivating layer. Its advantages over $SiO_2$ are:
1. higher dielectric constant
2. imperviousness to the diffusion of impurities
3. greater resistance to contamination
4. reduction in threshold voltage.

Many methods have been applied for producing silicon nitride films. These include direct nitridation of silicon by thermal treatment with a nitrogen containing gas, chemical vapor deposition, evaporation, sputtering and glow discharge processes. For each of the above methods, pattern definition is typically accomplished through optical lithography.

The obvious advantage of ion beam techniques over optical lithography is the ability to directly write lines and patterns on a substrate. In the manufacture of integrated circuit (IC) devices, the photolithographic and associated processes are in many cases the limiting factor to good yields. It is thus apparent that it may be advantageous to use alternative methods such as ion beam techniques. Additionally, it is anticipated that charged beam techniques (e.g. electron and ion) will provide the resolution necessary to meet the demand for the ever increasing miniaturization of circuit geometries as required in VLSI applications.

Previous attempts to produce silicon nitride with the use of ion beams have focused on implantation of $N^+$ or $N_2^+$ into a silicon substrate. The films synthesized by these methods have in general showed a deficiency in nitrogen relative to stoichiometric $Si_3N_4$. This may explain the inferior electrical characteristics of silicon nitride formed by ion implantation compared to chemical vapor deposited $Si_3N_4$.

It is accordingly an object of the invention to provide an alternative method which may be used in lieu of prior art methods that suffer from the above and other deficiencies.

SUMMARY OF THE INVENTION

This invention involves a new method for the synthesis of ultra-thin films of silicon nitride via the interaction of $NH_3$ absorbed on a silicon substrate and a low energy noble ion beam. Preferential absorption of $NH_3$ is effected by cooling of the substrate near the boiling point of $NH_3$. The ion beam is used to generate reactive N and Si species which combine to form compounds of silicon nitride. The physical appearance of the films formed by this method are comparable to those produced by low pressure chemical vapor deposition. In the synthesis, ultra-thin silicon nitride ($Si_xN_y$) films are generated by the direct interaction of a low energy noble ion beam with $NH_3$ physically absorbed on a silicon surface. The method affords the capability to directly write silicon nitride lines and patterns. Additionally, the method alleviates the nitrogen deficiency ordinarily prevalent in prior art ion beam methods. The invention is particularly advantageous in applications which require the use of ultra-thin insulating layers, such as in metal-insulator semiconductor (MIS) technology.

In the method of the invention ammonia is selectively absorbed on a silicon substrate surface by substantially cooling the substrate, e.g., in the order of $-40°$ C. or cooler, and directing a fine ion beam of a noble gas e.g. argon helium, neon, krypton and xenon to thereby produce a desired silicon nitride pattern on the substrate. Where necessary or desireable the patterned product may be annealed.

DESCRIPTION OF THE PREFERRED EMBODIMENTS

Figure 1:
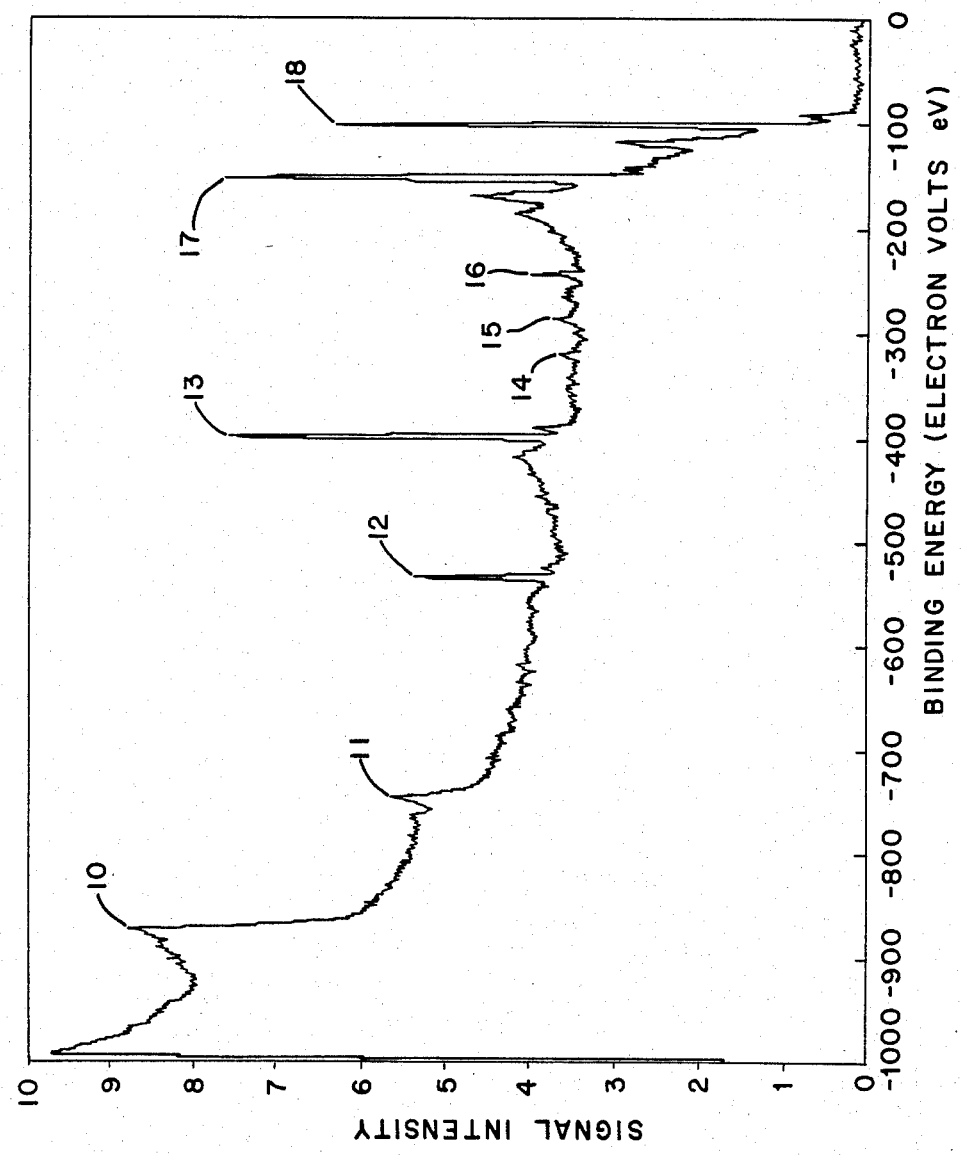
FIG. 1 is in a survey scan of an elemental analysis by electron spectroscopy for chemical analysis (ESCA) showing the content of Si and N in a test sample prepared in accordance with the invention.

In the invention the synthesis of ultra-thin silicon nitride ($Si_xN_y$) films is effected by the direct interaction of a low energy noble gas ion beam of a gas such as ($Ar^+$, $He^+$) with $NH_3$, physically absorbed on a silicon surface. Other gases of Group VIIIA of the periodic Table, e.g., $Ne^+$, $Kr^+$ $Xe^+$ may also be used. In the formula $Si_xN_y$, x generally has a value of about 1–3 and y has a value of 1–4.

The method of the present invention is applicable to any silicon substrate, regardless of its degree of crystallinity or the presence of dopants. For single crystalline substrates, no particular orientation is preferred.

The substrate is placed in a suitable vacuum system of which a base pressure $10^{-6}$ torr is most desirable. The vacuum system should include:
1. A capability of cooling the substrate or work piece to about $-125°$ C.
2. A capability of heating the substrate or work piece to at least $600°$ C.
3. A provision for introducing $NH_3$ gas in a controlled manner into the vacuum chamber
4. An ion gun capable of generating a beam of noble gas ions and aligned to a predetermined spot of the vacuum chamber. Additionally, it should be possible to deflect this beam in a known manner so that noble gas ions will strike selected areas of the substrate.

Cleaning of the substrate to remove surface contamination (e.g. oxides, hydrocarbons, etc.) is easily accomplished by bombardment with $Ar^+$ ions via sputtering. The ion gun used to effect the nitridation of silicon may also serve to clean the substrate. The conditions for sputter removal of contaminants are variable and person skilled in the art may select the appropriate set of parameters. If desired, annealing of the substrate may be performed in order to repair damage induced by the sputtering process. This step, however, is not altogether necessary.

After the cleaning process, the substrate is cooled to a temperature near the boiling point of $NH_3$. The cooling of the substrate is a necessary condition. Ordinarily cooling should be below about $-20°$ C. and preferably the substrate is cooled to a temperature of between about $-50°$ C. and $-80°$ C. This may be conveniently accomplished by passing cold $N_2$ gas through the substrate holder until attainment of the desired temperature. When this method is used, isolation of the $N_2$ gas from vacuum must be maintained. $NH_3$ gas is introduced into the vacuum chamber to a partial pressure of at least $10^{-9}$ torr and, preferably, the partial pressure is between $10^{-6}$ to $10^{-4}$ torr and allowed to absorb onto the cooled substrate surface. A beam of noble gas ions is rastered across the substrate in a manner so that the desired pattern is recorded. The ion beam energy will vary depending on the desired rate of nitride formation. However, energies in the range of 0.5-2.0 KeV are preferred.

After recording, unreacted $NH_3$ is desorbed by allowing the substrate to warm to ambient temperature or heating. Annealing of the substrate may be necessary to recrystallize those areas which have been nitrided.

A distinct advantage of ion beam techniques of the invention resides in the ability to directly write lines and patterns on a substrate. In the manufacture of IC devices, the photolithographic and associated processes are in many cases the limiting factor to good yields. Additionally, the use of the charged beam technique (e.g. electron and ion) of the invention provides the resolution necessary to meet the demand for the ever increasing miniaturization of circuit geometries as required in VLSI applications.

The invention will be further described by the following specific examples. It should be understood, however, that although these examples may describe in detail certain preferred operating conditions of the invention, they are provided primarily for purposes of illustration and the invention in its broader aspects should not the regarded as limited to such details.

EXAMPLE 1

Nitriding of single crystalline silicon was performed in the vacuum chamber of an ESCA/SAM electron spectrometer. The pressure inside the vacuum chamber was $7 \times 10^{-9}$ torr after introduction of the sample. The sample was initially cleaned by ion bombardment with 2.0 KeV Ar$^+$ ion for 15 minutes. $NH_3$ was leaked into the chamber until a partial pressure of $5.5 \times 10^{-8}$ torr was attained. Dynamic pumping of the vacuum chamber insured a replenishing of fresh $NH_3$ gas. The substrate was cooled to $-58°$ C. by passing cold $N_2$ gas from a liquid nitrogen source through the sample holder. The ion gun produced Ar$^+$ ions via electron impact from a hot tungsten filament source. The ions generated are focused and accelerated toward the substrate at an energy 2.0 KeV. An area of 6 mm $\times$ 6 mm was rastered for 12 minutes. In situ analyses by X-ray photoelectron spectroscopy (ESCA) indicated the formation of silicon nitride of various stoichiometries with the dominant species being $Si_3N_4$. The ESCA spectra run on the product of this example is given in FIG. 1. As shown in that figure, the binding energy in electron volts (eV) is plotted against relative signal intensity (an artisan scale). In the FIG. 1 representation the nitrogen peaks are shown at 10 and 13 and the oxygen peaks at 11 and 12. Implanted argon ions are shown as peaks 14 and 16; carbon at 15; and silicon at 17 and 18.

EXAMPLE 2

Figure 3:
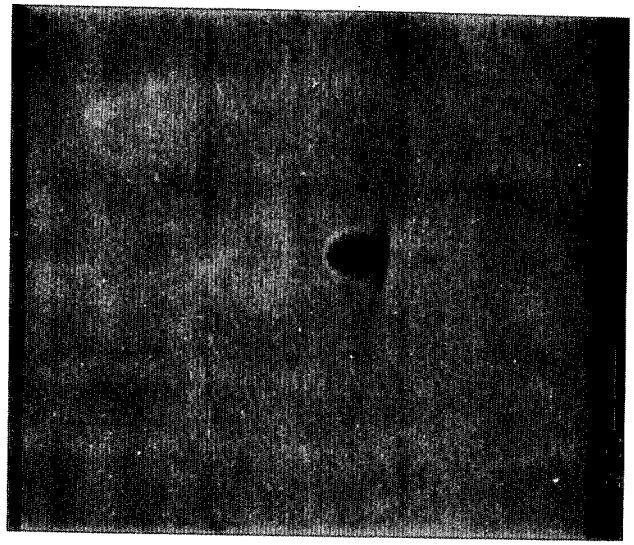
FIG. 3 is a comparative scanning electron micrograph of a surface sample prepared by a standard low pressure chemical vapor deposition.
Figure 2:
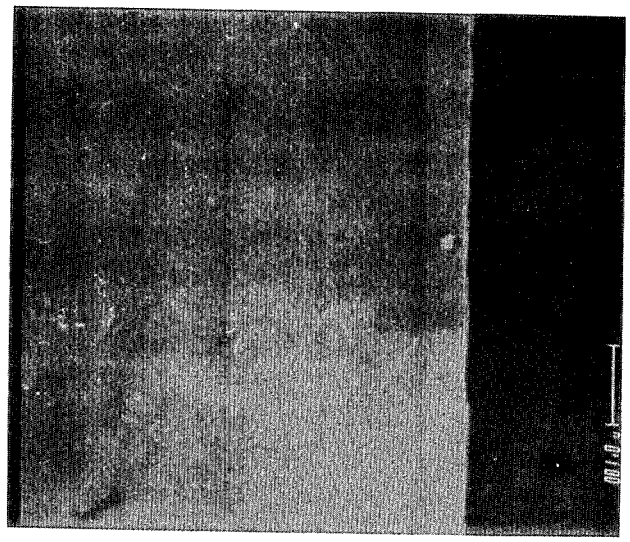
FIG. 2 is a scanning electron micrograph of the surface of a silicon substrate sample prepared by the ion beam technique of the invention.

Scanning electron micrographs were taken of the sample prepared in EXAMPLE 1 (FIG. 2) and compared to $Si_3N_4$ synthesized by low pressure chemical vapor deposition (FIG. 3). The two silicon nitride samples shown by the micrographs of FIG. 2 and FIG. 3 are nearly identical in physical appearance. The scale shown at the bottom of the micrograph, approximately one micron per one-half inch, indicates that the grain size is much smaller than one micron. The smoothness and fine texture of the film are essentially identical demonstrating that the method of the invention produces a film of suitable physical quality.

The intermediate silicon substrate on which the thin silicon nitride insulating layer has been applied in accordance with the method of the invention is regarded as a novel intermediate article of manufacture.

It will be apparent that various modification may be effected without departing from the scope of the invention and the several details disclosed as illustrative are note to be construed as placing limitations on the invention except as may be expressed in the appended claims.

What is claimed is:

1. A method of synthesizing a thin insulating film on a silicon substrate which comprises:
    (a) cooling the substrate
    (b) selectively absorbing ammonia on the cooled substrate; and
    (c) while still in the cooled condition, directing a fine ion beam of a noble gas on the ammonia treated substrate of step (b) to produce thereon the desired pattern of silicon nitride.

2. The method of claim 1 wherein the substrate is cooled in step (a) to a temperature of below about $-20°$ C.

3. The method of claim 2 wherein the temperature is between about $-50°$ C. and $-80°$ C.

4. The method of claim 1 wherein the product of step (c) is subsequently annealed.

5. The method of claim 1 wherein noble gas employed in step (c) as argon.

6. The method of claim 1 wherein the noble gas employed in step (c) is helium.

7. The method of claim 1 wherein the cooling temperature of step (a) is between about $-50°$ C.-$80°$ C. and noble gas in selected from the group consisting of argon, helium, neon krypton and xenon.

8. The method of claim 7 wherein the product of step (c) is subsequently annealed.

9. The method of claim 1 wherein the ammonia in step (b) is absorbed at a partial pressure of at least $10^{-9}$ torr.

10. The method of claim 1 wherein the ammonia in step (b) is absorbed at a partial pressure of between $10^{-6}$ to $10^{-4}$ torr.

11. The method of claim 3 wherein the ammonia in step (b) is absorbed at a partial pressure of between $10^{-6}$ and $10^{-4}$ torr.

12. The intermediate article of manufacture comprising a silicon substrate having thereon a thin silicon nitride layer generated in accordance with the method of claim 1.

13. The intermediate article of manufacture comprising a silicon substrate having thereon a thin silicon nitride layer generated in accordance with the method of claim 3.

14. The intermediate article of manufacture comprising a silicon substrate having thereon a thin silicon nitride layer generated in accordance with the method of claim 11.

* * * * *